United States Patent [19]

Yokoyama

[11] 4,331,929
[45] May 25, 1982

[54] GAIN-CONTROLLED AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 133,990

[22] Filed: Mar. 26, 1980

[30] Foreign Application Priority Data

Apr. 4, 1979 [JP] Japan .................................. 54-40436
Dec. 29, 1979 [JP] Japan .................................. 54-170816

[51] Int. Cl.³ .................................................. H03F 3/45
[52] U.S. Cl. .................................... 330/254; 330/252; 358/174
[58] Field of Search .................. 330/254, 252; 358/27, 358/174

[56] References Cited

U.S. PATENT DOCUMENTS

| | | | |
|---|---|---|---|
| 3,619,486 | 11/1971 | Tzakis .................................. | 330/252 |
| 3,684,974 | 8/1972 | Solomon et al. ..................... | 330/256 |
| 3,761,741 | 9/1973 | Hoeft .................................... | 330/254 |
| 3,961,360 | 6/1976 | Sato et al. ............................ | 358/27 |

*Primary Examiner*—James B. Mullins
*Assistant Examiner*—Gene Wan
*Attorney, Agent, or Firm*—Frishauf, Holtz, Goodman & Woodward

[57] ABSTRACT

A gain-controlled amplifier comprises first and second transistors connected in common-emitter configuration, third and fourth transistors connected in common-emitter configuration, a driver circuit responsive to application of an input signal thereto to vary the common-emitter current of the first and second transistors and common-emitter current of the third and fourth transistors in opposite phase relation with respect to each other, and an output circuit connected to the collectors of one of a first pair of the first and fourth transistors and a second pair of the second and third transistors for producing an output signal corresponding to the difference between the collector currents of the one pair of transistors. A control signal is applied between commonly connected bases of the first transistor pair and commonly connected bases of the second transistor pair. When the gain of the gain-controlled amplifier is set small, the collector currents of the transistors connected to the output circuit become small so that noise output voltage is reduced. In order to further reduce noise output voltage, an equal number (one or more) of PN junctions may be connected in series in the respective emitter circuits of the first to fourth transistors.

11 Claims, 6 Drawing Figures

FIG. 1

PRIOR ART

GAIN-CONTROLLED AMPLIFIER

BACKGROUND OF THE INVENTION

This invention relates to a gain-controlled amplifier, and, more particularly, to a gain-controlled amplifier the gain of which is controlled in accordance with a control voltage externally applied thereto.

Figure 1:
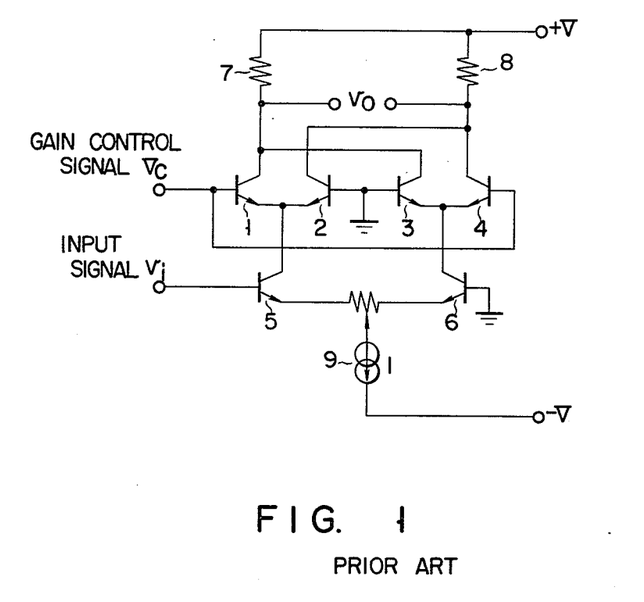
FIG. 1 is a schematic circuit diagram of a prior art gain-controlled amplifier.

FIG. 1 shows a prior art analog multiplier which may be used as a gain-controlled amplifier. The prior art gain-controlled amplifier is comprised of a first pair of differential transistors 1 and 2, a second pair of differential transistors 3 and 4, and a third pair of differential transistors 5 and 6. The transistors 1 and 4 have their collectors connected to a positive power supply terminal through collector load resistors 7 and 8, respectively, and the transistors 2 and 3 have their collectors connected to the collectors of transistors 4 and 1, respectively. The transistors 2 and 3 have their bases commonly connected to circuit ground, and the transistors 1 and 4 have their bases commonly connected to receive a control signal Vc. The transistor 5 has its collector connected to the commonly connected emitters of transistors 1 and 2 and its base connected to receive an input signal Vi to be amplified. On the other hand, the transistor 6 has its collector connected to the commonly connected emitters of transistors 3 and 4 and its base connected to circuit ground. The emitters of transistors 5 and 6 are commonly connected to a negative power supply terminal through a constant current source 9. An output signal Vo of the prior art circuit is obtained by subtracting collector voltage of one of the transistors 1 and 4 from collector voltage of the other of the transistors 1 and 4, and represented as follows:

$$Vo = K \cdot Vi \cdot f(Vc) \quad (1)$$

where K is a proportional constant and f(Vc) is a function of the control voltage Vc. The gain A of the circuit is, therefore, represented by $$A = \frac{Vo}{Vi} = K \cdot f(Vc) \quad (2)$$

That is, the gain of the circuit of FIG. 1 varies with the control voltage Vc and is substantially proportional to the magnitude of the control voltage Vc when it is relatively small.

For the purpose of decreasing the distortion factor of the above-mentioned gain control amplifier, the amplifier must be operated as a Class A amplifier. For Class A operation, the emitter current of each transistor in the circuit must be increased. However, the increase in the emitter current of transistor correspondingly increases noises produced within the amplifier circuit. Conversely, when the emitter current is decreased so as to reduce noises, the linear operating range of the amplifier will be decreased. As a result, the distortion factor of the amplifier will be increased. That is, with the gain-controlled amplifier of FIG. 1, it is not easy to reduce both of noises and distortion factor. Further, since, in the gain control amplifier of FIG. 1, the collectors of a pair of transistors 1 and 3 are commonly connected to the collector load resistor 7 and the collectors of another pair of transistors 2 and 4 are commonly connected to the collector load resistor 8, the current flowing through each of the collector load resistors 7 and 8 does not change with the control voltage Vc so that noise output voltage does not change as well. As a result, when the gain of the amplifier circuit is set small by the control voltage Vc the signal-to-noise ratio of the amplifier circuit will be deteriorated.

SUMMARY OF THE INVENTION

An object of this invention is to provide an improved gain control amplifier in which the signal-to-noise ratio at a small gain is improved without deteriorating the distortion factor.

Another object of the invention is to provide a gain-controlled amplifier in which the gain is controlled in accordance with an exponential function of control voltage externally applied thereto.

A gain-controlled amplifier of this invention is comprised of first, second, third and fourth transistors each having first, second and control electrodes, the first and second transistors being connected in differential configuration such that their second electrodes are commonly connected, the third and fourth transistors being connected in differential configuration such that their second electrodes are commonly connected, the first and fourth transistors having their control electrodes commonly connected, the second and third transistors having their control electrodes commonly connected, and a control signal being applied between the commonly connected control electrodes of the first and fourth transistors and the commonly connected control electrodes of the second and third transistors; a first circuit connected to the commonly connected second electrodes of the first and second transistors and the commonly connected second electrodes of the third and fourth transistors and responsive to application of an input signal thereto for varying a first common current of the first and second transistors and a second common current of the third and fourth transistors in opposite phase relation with respect to each other; and a second circuit connected to only the first electrodes of one of a first pair of the first and fourth transistors and a second pair of the second and third transistors for producing an output signal corresponding to difference between currents flowing through the one pair of transistors.

According to this invention, the currents flowing through the one pair of transistors connected to the second circuit decreases as the gain of the gain-controlled amplifier decreases so that noise output voltage can be reduced at small gain.

In order to further reduce the noise output voltage, an equal number (one or more) of PN junctions may be connected in series between the respective second electrodes of first to fourth transistors and the first circuit.

According to an embodiment of this invention, the second circuit is composed of load resistors connected to the first electrodes of the one pair of transistors, and a voltage subtractor for subtracting the voltage at the first electrode of one of the one pair of transistors from the voltage at the first electrode of the other of the one pair of transistors.

According to another embodiment of this invention the second circuit is composed of a current mirror load circuit connected to the first electrodes of the one pair of transistors and a current-to-voltage converter for converting output current of the current mirror load circuit into voltage.

DETAILED DESCRIPTION OF THE PREFERRED EMBODIMENTS

Prior to description of embodiments of this invention the reduction of noise output voltage of a conventional differential amplifier will be described. With a typical differential amplifier in which a pair of differential transistors have their collectors connected to a positive power supply terminal through collector load resistors, respectively, and their emitters commonly connected to a negative power supply terminal through a constant current source, and an input signal is applied between bases of the differential transistors, it is known in the art that the emitter resistance of each of the differential transistors is desired to be large in order to reduce the noise output voltage appearing between the collectors of differential transistors. It is further known that the emitter resistance of a transistor is inversely proportional to the emitter current of the transistor. It will be understood, therefore, that, to reduce the noise output voltage, it is effective to make the emitter current of the transistor small and/or to make the emitter resistance of the transistor seemingly large. This invention was made on the basis of the above-mentioned principle of noise reduction in the differential amplifier.

Figure 2:
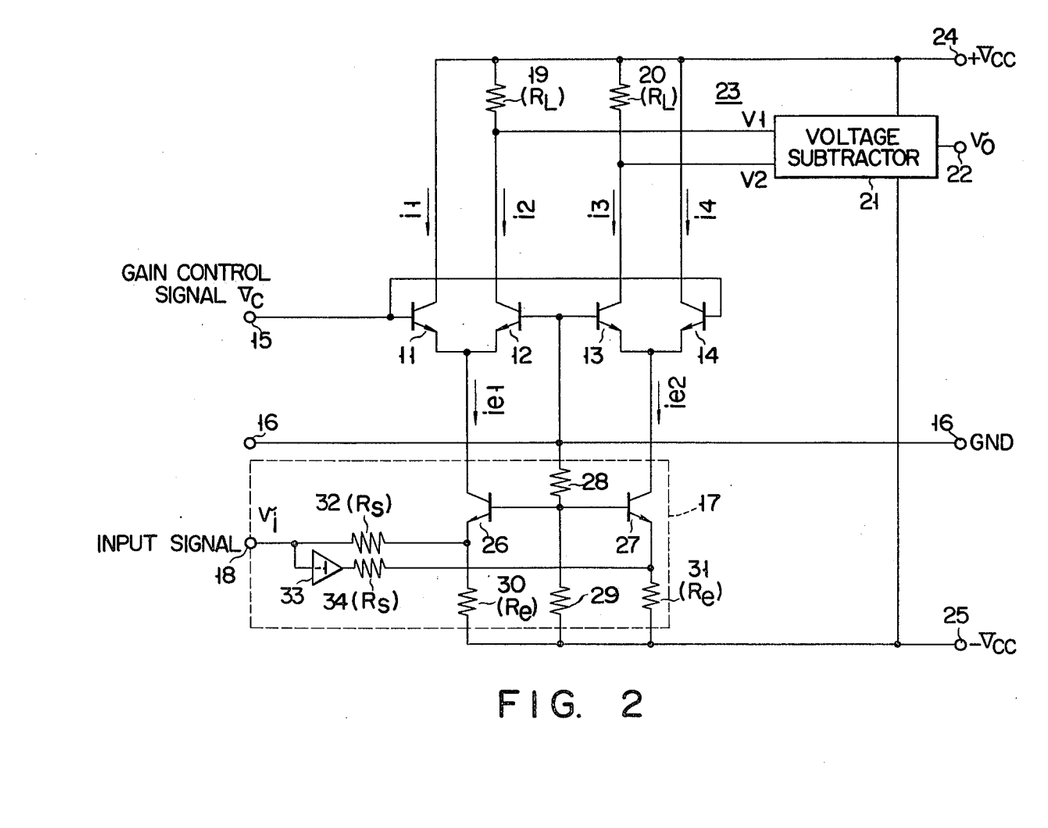
FIGS. 2 to 6 are schematic circuit diagrams of gain-controlled amplifiers embodying this invention.

There will now be described gain-controlled amplifiers of this invention with reference to the drawing. The gain-controlled amplifier according to this invention is comprised, as shown in FIG. 2, of first differential transistors 11 and 12 and second differential transistors 13 and 14, a pair of transistors 11 and 14 having their bases commonly connected to a control signal input terminal 15 to receive a gain control signal Vc and the other pair of transistors 12 and 13 having their bases commonly connected to a circuit ground terminal 16. A driver circuit 17 is responsive to an input signal whose amplitude is to be controlled, the input signal being applied to a signal input terminal 18 for changing the common-emitter current of differential transistors 11 and 12 and the common-emitter current of differential transistors 13 and 14 in the opposite phase relation with respect to each other. An output circuit 23 is provided for producing an amplitude-controlled output signal corresponding to the difference between collector currents of one of first and second transistor pairs 11 and 14; and 12 and 13.

More specifically, in the gain-controlled amplifier shown in FIG. 2, the transistor pair 11 and 14 have their collectors connected to a positive power supply terminal 24 (+Vc) and the transistor pair 12 and 13 have their collectors connected to the power supply terminal 24 through collector load resistors 19 and 20 having a resistance value of RL, respectively. The collectors of transistors 12 and 13 are connected to a voltage subtractor 21 having an output terminal 22 from which the amplitude-controlled output signal is derived.

The driver circuit 17 is comprised of transistors 26 and 27 which have their collectors respectively connected to the commonly connected emitters of differential transistors 11 and 12 and the commonly connected emitters of differential transistors 13 and 14, and their emitters connected to a negative power supply terminal 25 (−Vcc) through emitter resistors 30 and 31 having a resistance value of Re. The bases of transistors 26 and 27 are commonly connected to a connection point between resistors 28 and 29 connected in series between the negative power supply terminal 25 and circuit ground. The input terminal 18 to which input signal Vi is applied is connected to the emitter of transistor 26 through a resistor 32 having a resistance value of Rs and to the emitter of transistor 27 through an inverting amplifier 33 of unity gain and a resistor 34 having a resistance value of Rs.

The operation of the gain control amplifier shown in FIG. 2 will be described hereinafter. Assuming that the base current of transistor is negligibly small, the common-emitter current $ie_1$ of the differential transistors 11 and 12 and the common-emitter current $ie_2$ of the differential transistors 13 and 14 are represented as follows:

$$ie_1 = i_1 + i_2 \tag{3}$$

$$ie_2 = i_3 + i_4 \tag{4}$$

where $i_1$, $i_2$, $i_3$ and $i_4$ stand for collector currents of the transistors 11, 12, 13 and 14, respectively. Between the collector currents $i_1$ and $i_2$ of transistors 11 and 12 and between the collector currents $i_3$ and $i_4$ of transistors 13 and 14 there exist, as is well known, relationships represented as follows:

$$\frac{i_1}{i_2} = e^{K_1 \cdot V_c} \tag{5}$$

$$\frac{i_4}{i_3} = e^{K_1 \cdot V_c} \tag{6}$$

where $K_1 = \frac{q}{k \cdot T}$ k = Boltzmann constant
q = elementary charge
T = absolute temperature At the zero signal condition Vi=0, the common-emitter current $ie_1$ of differential transistors 11 and 12 and the common-emitter current $ie_2$ of differential transistors 13 and 14, that is, the collector currents of transistors 26 and 27 in the driver circuit 17 have an equal magnitude I which depends on the resistance value Rs of resistors 32 and 34 and the resistance value Re of resistors 30 and 31 because the signal input terminal 18 is coupled through resistors 32 and 34 to the emitters of transistors 26 and 27 with their bases biased by a predetermined negative voltage. Therefore, the common-emitter currents $ie_1$ and $ie_2$ at the signal input condition are given by $$ie_1 = I + ia \tag{7}$$

$$ie_2 = I + ib \tag{8}$$

where ia and ib are signal components varying with an input signal applied to the input terminal 18.

Solving for the collector currents $i_2$ and $i_3$ of transistors 12 and 13 from equations (3) through (8) yields $$i_2 = \frac{I + ia}{e^{K_1 \cdot V_c} + 1} \tag{9}$$

$$i_3 = \frac{I + ib}{e^{K_1 \cdot V_c} + 1} \tag{10}$$

The output signal Vo of the gain-controlled amplifier provided at the output terminal 22 of the voltage subtractor 21 is given by $$Vo = V1 - V2 \quad (11)$$

where V1 and V2 represents collector voltages of transistors 12 and 13. The collector voltages V1 and V2 of transistors 12 and 13 are represented as follows:

$$V1 = Vcc - RL \cdot i_2 \quad (12)$$

$$V2 = Vcc - RL \cdot i_3 \quad (13)$$

Substituting equations (12) and (13) into equation (11) yields $$Vo = RL \cdot (i_3 - i_2) \quad (14)$$

Substituting equations (9) and (10) into equation (14) yields $$Vo = \frac{RL \cdot (ib - ia)}{e^{K_1 \cdot Vc} + 1} \quad (15)$$

The emitter voltages of transistors 26 and 27 in the driver circuit 17 are a predetermined voltage (about 0.65 V) below the base voltage thereof and thus currents flowing through the resistors 30 and 31 are fixed constant. Accordingly, the signal components ia and ib of the common-emitter currents $ie_1$ and $ie_2$ are given by $$ia = -\frac{Vi}{Rs} \quad (16)$$

$$ib = \frac{Vi}{Rs} \quad (17)$$

Substituting equations (16) and (17) into equation (15) yields $$Vo = \frac{2RL}{Rs} \cdot \frac{Vi}{e^{K_1 \cdot Vc} + 1} \quad (18)$$

From equation (18) the gain A of the gain-controlled amplifier is found to be $$A = \frac{Vo}{Vi} = \frac{2RL}{Rs \cdot (e^{K_1 \cdot Vc} + 1)} \quad (19)$$

It will be understood from equations (18) and (19) that the amplitude of output signal Vo is proportional to that of the input signal Vi and the gain A varies in accordance with an exponential function of control voltage Vc. As is evident from equation (19) the gain A of the gain-controlled amplifier configured as shown in FIG. 2 decreases with increase in magnitude of the control voltage Vc applied to the control terminal 15. In the circuit of FIG. 2, if the control voltage Vc is applied to the bases of transistors 12 and 13, and the bases of transistors 11 and 14 are grounded, then the gain A will decrease with decrease in magnitude of the control voltage Vc.

According to the gain-controlled amplifier of this invention, the collector currents $i_2$ and $i_3$ of transistors 12 and 13 decrease as the gain A decreases because the collectors of transistors 11 and 14 are not such that they are, like the prior art circuit of FIG. 1, connected to the collectors of transistors 13 and 12, respectively. As a result, noise voltage appearing at the output terminal 22 becomes small when the gain A is decreased. Namely, with the gain-controlled amplifier of this invention, a high signal-to-noise ratio can be obtained in small gain conditions.

Figure 3:
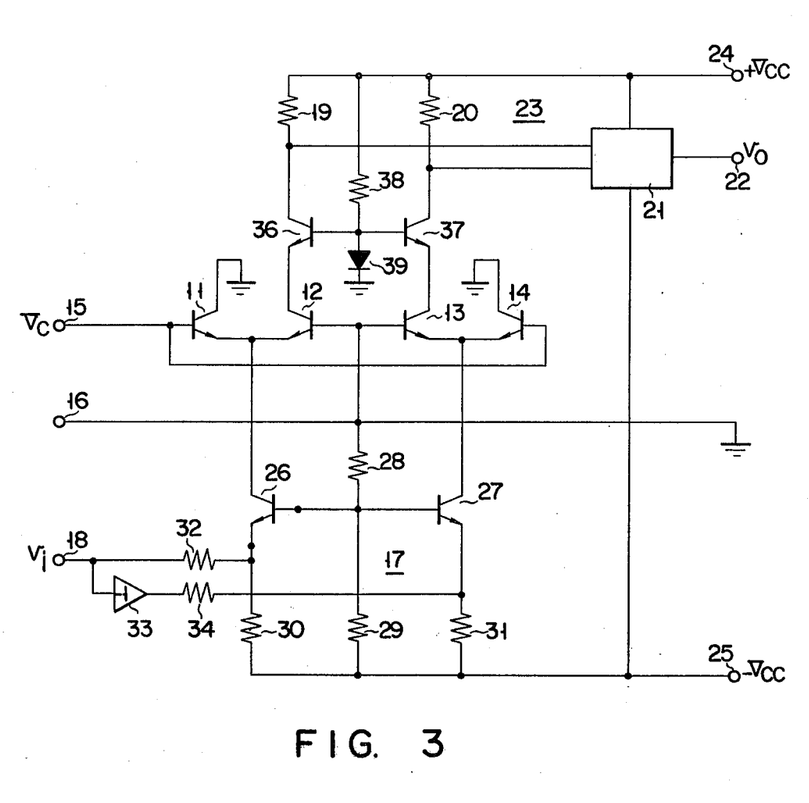

FIG. 3 shows a gain-controlled amplifier according to another embodiment of this invention in which the gain-controlled amplifier of FIG. 2 is so modified as to improve high frequency response. That is, the collectors of transistors 11 and 14 are connected to circuit ground and common-base transistors 36 and 37 are connected between the collector resistor 19 and the collector of transistor 12 and between the collector resistor 20 and the collector of transistor 13, respectively. The bases of transistors 36 and 37 are connected to a connection point of a resistor 38 and a diode 39 connected in series between the positive power supply terminal 24 and circuit ground so that the bases of transistors 36 and 37 are biased by the diode voltage (about 0.65 V) across the diode 39. A pair of common-base transistor 36 and common-emitter transistor 12 and the other pair of common-base transistor 37 and common-emitter transistor 13 each form the cascade connection. Due to the cascade connection, the collectors of transistors 12 and 13 are virtually grounded since the base-to-emitter voltage of each of transistors 36 and 37 is equal to the voltage drop across the diode 39. Namely, in the circuit of FIG. 3, the transistors 11 and 14 have their collectors actually grounded and the transistors 12 and 13 have their collectors virtually grounded. As a result the transistors 11 to 14 may operate in substantially the same operating condition as an ideal PN junction so that distortion resulting from different operating conditions of transistors is decreased. Further, the collector-to-emitter voltage of each of transistors 11 to 14 is reduced to about 0.65 V so that thermal noises produced by the transistors 11 to 14 decrease.

Figure 4:
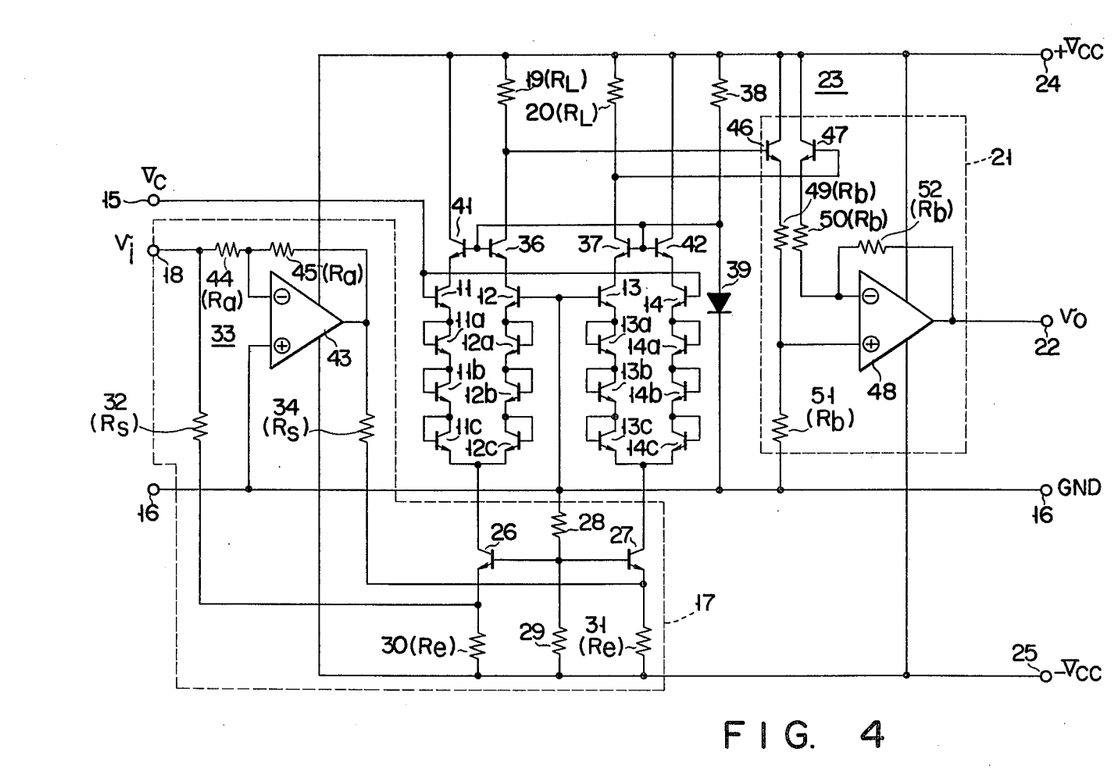

FIG. 4 shows still another embodiment of this invention with like reference numerals used to designate like parts in FIGS. 2 and 3. With this embodiment, the emitter resistance of each of transistors 11 to 14 is seemingly increased by provision of an equal number (one or more) of PN junctions between the respective emitters of transistors 11 to 14 and the driver circuit 17 for the purpose of further decreasing output noise voltage. More specifically, in the illustrated embodiment, three diode-connected transistors 11a to 11c each with collector short-circuited to base are connected in series with each other in the emitter circuit of transistor 11, three diode-connected transistors 12a to 12c in the emitter circuit of transistor 12, three diode-connected transistors 13a to 13c in the emitter circuit of transistor 13 and three diode-connected transistors 14a to 14c in the emitter circuit of transistor 14. Accordingly, the apparent emitter resistance of each of transistors 11 to 14 is quadrupled so that the noise output voltage is halved. In general, when N diode-connected transistors or PN junctions are connected in series in the respective emitter circuits of transistors 11 to 14, the noise output voltage becomes $1/\sqrt{N+1}$. The gain A of the gain-controlled amplifier of FIG. 4 is given by $$A = \frac{2RL}{Rs \cdot (e^{K_1 \cdot Vc/4} + 1)} \quad (20)$$

In the circuit of FIG. 4, the common-base transistors 36 and 37 are connected, like the circuit of FIG. 3, to the collectors of transistors 12 and 13 and further, common-base transistors 41 and 42 are connected between the power supply terminal 24 and the collector of transistor 11 and between the power supply terminal 24 and the collector of transistor 14, respectively. Due to these cascade connections the collectors of transistors 11 to 14 are virtually grounded so that signal-to-noise ratio and distortion characteristics are improved.

The inverting amplifier 33 of unity gain may be formed, as shown in FIG. 4, of an operational amplifier 43 having its noninverting input connected to circuit ground, a resistor 44 having a resistance value of Ra and connecting the control signal input 18 to the inverting input of operational amplifier 43, and a resistor 45 having the same resistance value as the resistor 44 and connected between the inverting input and output of operational amplifier 43.

The voltage subtractor 21 may be formed, as shown in FIG. 4, of transistors 46 and 47 having their collectors commonly connected to the power supply terminal 24 and their bases connected to the collectors of transistors 36 and 37, respectively, an operational amplifier 48 having its output connected to the output terminal 22, a resistor 49 connecting the emitter of transistor 46 to the noninverting input of operational amplifier 48, a resistor 50 connecting the emitter of transistor 47 to the inverting input of operational amplifier 48, a resistor 51 connected between the noninverting input of operational amplifier 48 and circuit ground, and a resistor 52 connected between the output and inverting input of operational amplifier 48. The resistors 49 to 52 have an equal resistance value of Rb. The emitter follower transistors 46 and 47 are provided to increase an input impedance of the operational amplifier 48.

Figure 5:
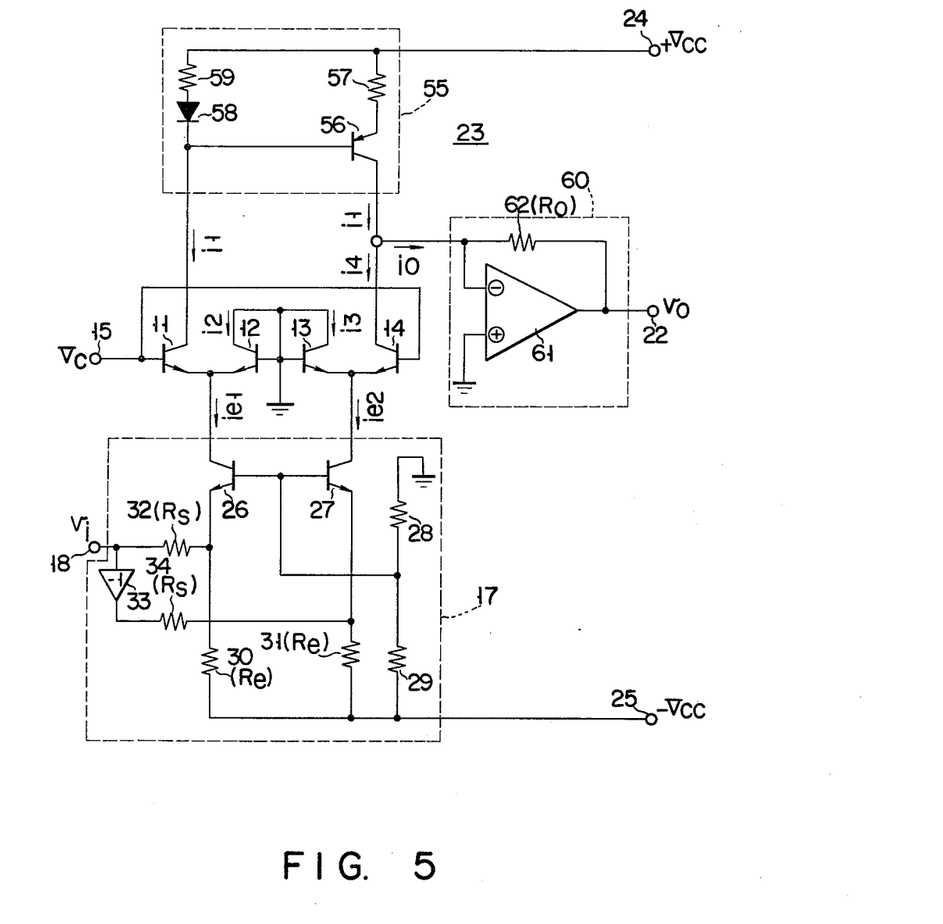

FIG. 5 shows still another embodiment of this invention with like reference numerals used to designate like parts in FIGS. 2 to 4. In this embodiment, the output circuit 23 is formed of a current mirror circuit 55 and a current-to-voltage converter 60. More specifically, the current mirror circuit 55 is comprised of a transistor 56 having its collector connected to the collector of transistor 14 and its base connected to the collector of transistor 11, a resistor 57 connecting the emitter of transistor 56 to the power supply terminal 24, and a diode 58 and a resistor 59 connected in series between the power supply terminal 24 and the collector of transistor 11. The collectors of transistors 12 and 13 are grounded as shown. The current-to-voltage converter 60 is comprised of an operational amplifier having its inverting input connected to the connection point of transistors 14 and 56, its noninverting input connected to circuit ground and its output connected to the output terminal 22, and a resistor 62 having a resistance value of Ro and connected between the output and inverting input of the operational amplifier 61.

In the gain-controlled amplifier shown in FIG. 5, current $i_0$ flowing into the current-to-voltage converter 60 is given by $$i_0 = i_1 - i_4 \quad (21)$$

The current $i_0$ is converted into voltage $V_o$ by the current-to-voltage converter 60 as follows:

$$V_O = -i_0 \cdot R_o \quad (22)$$

As seen from the above-mentioned description of the gain-controlled amplifier of FIG. 2, the currents $i_1$ and $i_4$ are represented as follows:

$$i_1 = \frac{1}{1 + e^{-K_1 \cdot V_c}} \cdot i e_1 = \frac{1}{1 + e^{-K_1 \cdot V_c}} \cdot (I + ia) \quad (23)$$

$$i_4 = \frac{1}{1 + e^{-K_1 \cdot V_c}} \cdot i e_2 = \frac{1}{1 + e^{-K_1 \cdot V_c}} \cdot (I + ib) \quad (24)$$

Accordingly, the current $i_0$ is given by $$i_0 = \frac{1}{1 + e^{-K_1 \cdot V_c}} \cdot (ia - ib) \quad (25)$$

From equations (16), (17), and (21) to (25) the output signal is found to be $$V_o = \frac{2R_o \cdot V_i}{(1 + e^{-K_1 \cdot V_c})R_s} \quad (26)$$

As will be understood from equation (26) the gain of the gain-controlled amplifier of FIG. 5 increases with increase in the control voltage $V_c$. In the circuit of FIG. 5, if the current mirror circuit 55 is connected to the collectors of transistors 12 and 13 and the collectors of transistors 11 and 14 are grounded, then the gain-controlled amplifier is modified such that its gain decreases with increase in the control voltage $V_c$.

Figure 6:
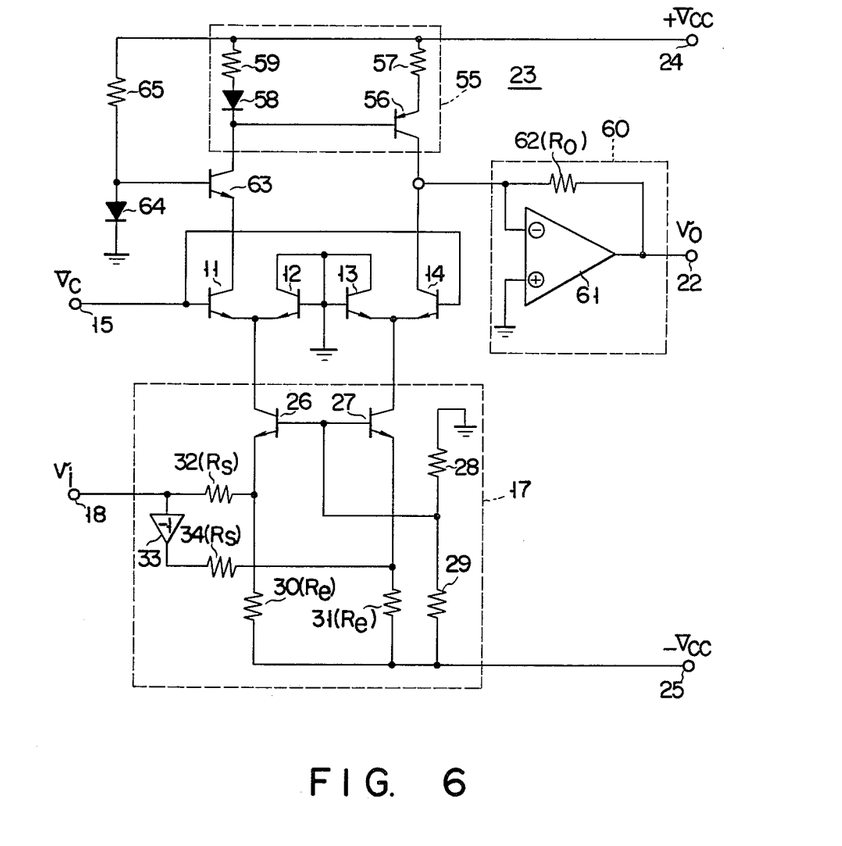

Since the collector of transistor 14 is connected to the inverting input of operational amplifier 61 the noninverting input of which is grounded, the collector of transistor 14 is virtually grounded. Accordingly, in order for the transistor 11 to operate in the same condition as the transistor 14 it is preferred that the collector of transistor 11 be virtually grounded. To this end, the gain-controlled amplifier of FIG. 5 may be modified as shown in FIG. 6. In the gain-controlled amplifier of FIG. 6, a common-base transistor 63 is connected between the current mirror circuit 55 and the collector of transistor 11. The base of transistor 63 is biased by the voltage drop across a diode 64 connected in series with a resistor 65 between the power supply terminal 24 and circuit ground.

The above-mentioned gain-controlled amplifiers of this invention are very suited for an electronic volume control circuit in an audio amplifier system because its gain varies exponentially with a control voltage applied thereto. In this case, as a volume control potentiometer which is connected across a control voltage source and applies varying control voltage to the gain-controlled amplifier, use may be made of a potentiometer of a type in which resistance between its slider and its one terminal varies linearly with the slider position.

Although, in the illustrated gain-controlled amplifiers embodying this invention, bipolar transistors are used, unipolar transistors or field effect transistors may be used instead, in which case the gain of a gain-controlled amplifier varies in accordance with quadratic function of the control voltage.

What is claimed is:
1. A gain-controlled amplifier comprising:
 first, second, third and fourth transistors each having first, second and control electrodes, said first and second transistors being connected in differential configuration and having their second electrodes commonly connected, said third and fourth transis- tors being connected in differential configuration and having their second electrodes commonly connected, a first pair of said first and fourth transistors having their control electrodes commonly connected, a second pair of said second and third transistors having their control electrodes commonly connected, and a control signal being applied between said commonly connected control electrodes of said first and fourth transistors and said commonly connected control electrodes of said second and third transistors;

first circuit means coupled to said commonly connected second electrodes of said first and second transistors and said commonly connected second electrodes of said third and fourth transistors and responsive to application of an input signal thereto for varying a first common current of said first and second transistors which substantially equals the sum of respective currents flowing through said first and second differential transistors and a second common current of said third and fourth transistors which substantially equals the sum of respective currents flowing through said third and fourth differential transistors in opposite phase relationship with respect to each other;

a source of voltage;

said first circuit means including fifth and sixth transistors each having first, second and control electrodes, said first electrode of said fifth transistor being connected to said second electrodes of said first and second differential transistors and said first electrode of said sixth transistor being connected to said second electrodes of said third and fourth differential transistors, and said control electrodes of said fifth and sixth transistors being commonly connected to said voltage source; first and second resistors respectively connecting said second electrodes of said fifth and sixth transistors to a power supply terminal; and third and fourth resistors respectively coupling input signals of opposite polarity to said second electrodes of said fifth and sixth transistors; and second circuit means coupled to said first electrodes of one of said first and second pairs of transistors for producing an output signal corresponding to the difference between respective currents flowing through said one pair of transistors.

2. The gain-controlled amplifier according to claim 1 wherein said second circuit means includes first and second load resistors connected to said first electrodes of said one pair of transistors, respectively, and a voltage subtractor for producing a signal corresponding to the difference between output voltages at said first electrodes of said one pair of transistors.

3. The gain-controlled amplifier according to claim 1 wherein said second circuit means includes a current mirror load circuit connected to said first electrodes of said one pair of transistors, and a current-to-voltage converter connected to said first electrode of one transistor of said one pair of transistors.

4. The gain-controlled amplifier according to claim 1 wherein said first to fourth transistors are bipolar transistors of the same conductivity type and each have collector, emitter and base as said first, second and control electrodes, and said second circuit means includes first and second load resistors respectively connecting said collectors of said one pair of transistors of said first and second pairs of transistors to a power supply terminal, and a voltage subtractor for producing a signal corresponding to the difference between collector voltages of said one pair of transistors.

5. The gain-controlled amplifier according to claim 4 wherein said collectors of the other pair of said first and second pairs of transistors are coupled to said power supply terminal.

6. The gain-controlled amplifier according to claim 4 wherein said collectors of the other pair of said first and second pairs of transistors are grounded, and first and second common-base transistors are respectively connected between said first load resistor and said collector of one of said one pair of transistors and between said second load resistor and said collector of the other of said one pair of transistors.

7. The gain-controlled amplifier according to claim 4 wherein first, second, third and fourth common-base transistors are respectively connected between said power supply terminal and said collector of one of the other pair of said first and second pairs of transistors, between said first load resistor and said collector of one of said one pair of transistors, between said second load resistor and said collector of the other of said one pair of transistors, and between said power supply terminal and said collector of the other of said other pair of transistors.

8. The gain-controlled amplifier according to claim 1 wherein said first to fourth transistors are bipolar transistors of the same conductivity type and each have collector, emitter and base as said first, second and control electrodes, and said second circuit means includes a current mirror load circuit connected to said collectors of said one of said first and second pairs of transistors, and a current-to-voltage converter connected to said collector of one transistor of said one pair of transistors.

9. The gain-controlled amplifier according to claim 8 wherein the other pair of said first and second pairs of transistors each have its collector grounded, and said current-to-voltage converter includes a differential amplifier having a first input connected to said current mirror load circuit, a second input grounded, and an output, and a resistor connected between said first input and output of said differential amplifier, and a common-base transistor is connected between said current mirror load circuit and said collector of the other transistor of said one pair of transistors.

10. The gain-controlled amplifier according to any one of claims 1, 4, 5, 6 or 8 wherein one or more PN junctions are connected in series between said second electrode of each of said first to fourth transistors and said first circuit means.

11. The gain-controlled amplifier according to claim 1 wherein said fifth and sixth transistors are bipolar transistors each having collector, emitter and base as said first, second and control electrodes.

* * * * *